United States Patent
Kappler (10) Patent No.: US 7,267,522 B2
(45) Date of Patent: Sep. 11, 2007

(54) METHOD AND DEVICE FOR THE INTRODUCTION OF PLANAR SUBSTRATES INTO A RECEIVING CONTAINER

(75) Inventor: Heinz Kappler, Dornstetten-Aach (DE)

(73) Assignee: Gebr. Schmid GmbH & Co., Freudenstadt (DE)

( * ) Notice: Subject to any disclaimer, the term of this patent is extended or adjusted under 35 U.S.C. 154(b) by 206 days.

(21) Appl. No.: 10/494,773

(22) PCT Filed: Oct. 29, 2002

(86) PCT No.: PCT/EP02/12038

§ 371 (c)(1),
(2), (4) Date: Dec. 20, 2004

(87) PCT Pub. No.: WO03/041476

PCT Pub. Date: May 15, 2003

(65) Prior Publication Data

US 2005/0105999 A1    May 19, 2005

(30) Foreign Application Priority Data

Nov. 5, 2001    (DE) ................. 101 54 889

(51) Int. Cl.
*A01D 90/08*    (2006.01)
*B65G 57/00*    (2006.01)
*B65H 29/32*    (2006.01)

(52) U.S. Cl. .................. 414/802; 414/789.5; 414/793; 414/793.1

(58) Field of Classification Search ............ 414/789.2, 414/789.5, 789.6, 793, 793.5, 790.4, 791.1, 414/792.7, 791, 790.9, 927, 797, 222.07, 414/287, 288, 332, 799; 271/14; 53/235, 53/247, 249, 250; 221/200, 211
See application file for complete search history.

(56) References Cited

U.S. PATENT DOCUMENTS 4,978,275 A * 12/1990 Reid et al. ............... 414/789.5
(Continued)

FOREIGN PATENT DOCUMENTS

DE    8327161 U1    3/1984
(Continued)

OTHER PUBLICATIONS

International Search Report dated Apr. 11, 2003 (5 pages).

*Primary Examiner*—Patrick Mackey
*Assistant Examiner*—Gregory W Adams
(74) *Attorney, Agent, or Firm*—Flynn, Thiel, Boutell & Tanis, P.C.

(57) ABSTRACT

One embodiment of the invention is a method for placing circuit boards in a receiving container, comprising the following steps: a) gripping and lifting a circuit board with a first grappling device, b) moving the first grappling device and the receiving container relative to each other, such that the receiving container is located below the first grappling device, c) the first grappling device lowers the circuit board into the receiving container, d) gripping and lifting a partition layer from a dispenser with a second grappling device, e) reversion to step b), such that the receiving container is accessible from above and is below the second grappling device, f) the partition layer is placed in the receiving container on top of the previously placed circuit board and g) start the process at a).

12 Claims, 10 Drawing Sheets

U.S. PATENT DOCUMENTS 5,791,250 A * 8/1998 Blake et al. ................. 101/483
5,899,341 A * 5/1999 Irita ........................... 209/571
6,006,638 A * 12/1999 Eltringham .................... 83/86

FOREIGN PATENT DOCUMENTS

| EP | 0165561 | A2 | | 12/1985 |
|---|---|---|---|---|
| EP | 0893379 | A1 | | 1/1999 |
| JP | 01053919 | A | * | 3/1989 |
| JP | 2000302245 | A | * | 10/2000 |
| JP | 2001039611 | A | * | 2/2001 |

* cited by examiner

METHOD AND DEVICE FOR THE INTRODUCTION OF PLANAR SUBSTRATES INTO A RECEIVING CONTAINER

FIELD OF APPLICATION AND STATE OF THE ART

The invention relates to a method and a device for the introduction of flat substrates into a receiving container.

Substrates in the circuit board industry are placed in the form of circuit boards or the like and placed into receiving containers after treatment in order to store them and/or transport them on to other locations. Since these substrates can be very thin and thus mechanically very sensitive, great care must be taken on the one hand. On the other hand it is important to move the substrates after their delivery on transporting means or the like as quickly as possible into a receiving container. Grappling devices are utilized for this purpose which grip the substrates and move them into a receiving container. Partition layers are moved between the individual substrates. These partition layers are also removed by a grappling device from a suitable store and are placed into the receiving container or onto a substrate.

Purpose and Solution

The basic purpose of the invention is to produce an aforementioned method and a device for the introduction of planar substrates into a receiving container, with which on the one hand the substrates are carefully handled and on the other hand substrates and partition layers can be placed alternately as quickly as possible into a receiving container.

This purpose is attained by a method with the characteristics of Claim 1 and a device with the characteristics of Claim 11. Advantageous and preferred embodiments of the invention are the subject matter of the subclaims and will be discussed in greater detail hereinafter. The claims are worded with an expressed reference to the content of the description.

A method according to the invention has the following steps:

a) A substrate is gripped with a first grappling device and is lifted by the transporting means.

b) The first grappling device and the receiving container are moved relative to one another so that the receiving container is located in the operating range or below the first grappling device.

c) The first grappling device places the substrate into the receiving container, that is, preferably in the position according to step b).

d) A second grappling device grips a partition layer from a store of partition layers and lifts them.

e) The step b) is reversed such that the receiving container is accessible from above or is located for the prescribed filling by the second grappling device below same.

f) The partition layer is placed by the second grappling device into the receiving container onto the earlier introduced substrate.

g) The process is started once again at step a) and is repeated.

The above-described method steps are steps which take place in any case. It is thereby possible to carry out further steps therebetween, in addition to the above-disclosed ones. In particular it is possible that one of the steps c) to f) occurs simultaneously with at least one other one of the steps c) to f). Also it is viewed as lying within the scope of the here claimed invention to exchange in the time sequence step c) with step d) or step d) with e).

The substrates can be delivered by transporting means, for example a roller conveyor. The substrates thereby lie advantageously flat. They are moved into the receiving container by the first grappling device. A movement of the grappling devices between the gripping of substrate or partition layer and their placement into the receiving container occurs preferably essentially vertically.

To simplify the design of such a device at least one of the two grappling devices is stationarily arranged in horizontal direction, which means it is not moved during operation. The two grappling devices are thus, in one embodiment of the invention, stationary in horizontal direction and essentially can only be moved vertically.

The receiving container can be moved laterally in the horizontal direction. This occurs preferably along the direction between the two grappling devices. The receiving container is particularly preferably moved exactly between the two grappling devices or between positions below the two grappling devices. This can be such that the receiving container is moved between a position for the introduction of the substrate below the first grappling device and a position for the introduction of the partition layer below the second grappling device. It can thereby be provided that the first grappling device is arranged above the transporting means for the substrates and thus does not need to be moved horizontally.

The grappling devices have each advantageously a special design. The first grappling device is intended for the substrates and the second grappling device for the partition layers. This can, as will become clear hereinafter, have an affect on construction, function, position and also mobility.

Furthermore it is possible to move the receiving container above the plane of the transporting means for the substrates, in particular above the transporting means. The substrate can thereby be lifted, when the receiving container is not in this position, by means of the first grappling device from the transporting means. The receiving container is subsequently positioned or moved below the first grappling device and the substrate is placed into said receiving container.

The receiving container is advantageously moved above the plane of the partition layer store. It can in particular be moved above the store in such a manner that, when the receiving container is not in this position, a partition layer is lifted from the store in a vertical movement by means of the second grappling device and is placed into the receiving container positioned therebelow.

One partition layer and one substrate are advantageously alternately moved into the receiving container. The receiving container can be moved back and forth between a position below the first grappling device and a position below the second grappling device.

The store of partition layers is, in a further exemplary embodiment of the invention, a movable storage container, whereby the mobility exists in particular in horizontal direction. The storage container can be moved between a position for introducing the substrate above the transporting means and a position for introducing the partition layer below the second grappling device.

It can be provided that one of the two grappling devices is moved in a horizontal direction between a position above the transporting means and a position above the receiving container. The receiving container can thereby be advantageously stationary at least while it is being filled. Whereas the storage container is moved at least into one position in which the second grappling device can remove a partition layer from said storage container. It is hereby advantageously provided that the first grappling device is moved laterally in a horizontal direction. This can occur in particular between a position for the introduction of the substrate above the transporting means, and a position below the second grappling device, which is stationary in a horizontal direction. The second grappling device can grip a partition layer out of the storage container, while the two grappling devices, the receiving container and the storage container are arranged in a vertical direction one above the other.

It is particularly advantageous when the storage container is configured to move in a similar manner as the first grappling device, for example simultaneously and/or along the same path. The storage container is moved, in a particularly preferred manner, simultaneously with the first grappling device. They can thereby, in particular, be mechanically coupled, thus requiring merely one single drive.

In order to also be able to move mechanically sensitive and very thin substrates, the substrates, and in particular, also the partition layers, are moved lying flat or rather horizontally. They can advantageously also be moved in this position into the receiving container and can thus remain the entire time in this position.

A device for the introduction of thin substrates into a receiving container, which operates in accordance with the aforedescribed method, can provide that it moves between the substrates partition layers into the receiving container. Transporting means for the delivery of the substrates and a store of partition layers are provided. Transporting means and store can be designed, for example, as above described.

A first grappling device is provided to grip, move and place the substrates. A second grappling device is provided to grip, move and place the partition layers. Both grappling devices are designed at least for one movement in a vertical direction. At least one of the two grappling devices is thereby stationarily arranged in a horizontal direction. The other grappling device can, if need be, be moved horizontally.

The receiving container can be designed movably in a horizontal direction, for example, by means of a suitable drive. The path of movement extends at least between a position below the first grappling device and a position below the second grappling device.

Both grappling devices are stationary in a horizontal direction in a first exemplary embodiment of the invention. It can thereby be provided that the path of movement of the receiving container extends above the transporting means and reaches preferably at least at one point above the transporting means. The first grappling device, the receiving container and the transporting means can here be arranged in this position and essentially along a vertical line above one another.

The receiving container can, in a further embodiment, be moved above the store of the partition layers. Its path of movement can extend at least above the store, whereby in particular, in this position of the receiving container, the second grappling device, the receiving container and the store can be arranged one above the other essentially along a vertical line. In each case this vertical arrangement one above the other makes it possible to move substrates and partition layers into the receiving container through purely vertical movements of the grappling devices.

The store, particularly when designed as a storage container in a second exemplary embodiment of the invention, can be moved in a horizontal direction. A path of movement can extend between a position for the introduction of a substrate below the first grappling device and a position for the introduction of a partition layer below the second grappling device, and can preferably end there in each case. A grappling device can thereby be movable in a horizontal direction between a position above the transporting means, stationarily arranged in this case, and a position above the receiving container. The receiving container is here advantageously stationary and nonmovable during filling and does generally not need to be moved during filling. The first grappling device for the substrates can here be advantageously moved.

To simplify the design, it is possible to couple the storage container with the movable grappling device to provide for joint movement. Driving means can be provided, which move the storage container and the grappling device along a mechanical guide, for example a horizontally extending guide rail. It is also advantageous to provide a suitable control for the method, which control can be designed by a man skilled in the art in accordance with his technical knowledge.

The second grappling device can furthermore be arranged in a plane above the first grappling device, in particular at a distance therefrom. It can thus be possible to move the storage container between the two grappling devices.

The grappling devices themselves can be designed such that they have a base mounting, which can, if needed, be horizontally movable. A vertically movable grappling arm can be arranged on this base mounting. The grappling arm can have downwardly pointing or downwardly activatable grappling means, which form a horizontal plane or lie in such a plane.

These and further characteristics can be taken from the claims and also from the description and the drawings, whereby the individual characteristics can be realized each by itself alone or several together in the form of subcombinations in an embodiment of the invention and in other fields, and can represent advantageous and by itself protectable embodiments, for which protection is claimed here. The division of the application into separate sections and inbetween titles does not limit the disclosure made under these titles in their universal validity.

BRIEF DESCRIPTION OF THE DRAWINGS

Two exemplary embodiments of the invention are illustrated in the drawings and will be discussed in greater detail hereinafter. In the drawings.

DETAILED DESCRIPTION OF THE EXEMPLARY EMBODIMENTS

Figure 1:
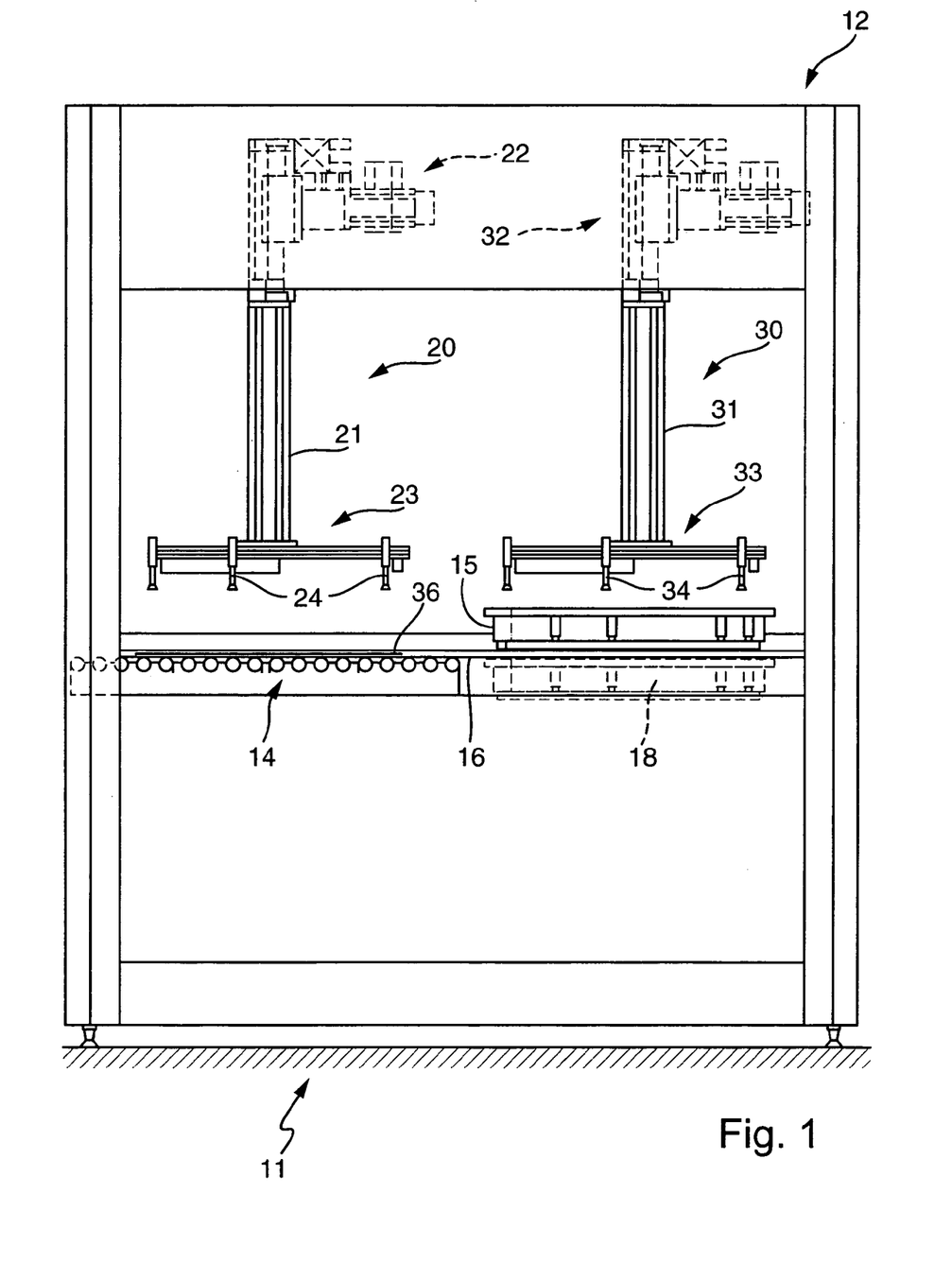
FIGS. 1 to 8 illustrate a first exemplary embodiment of the invention, whereby the grappling devices are stationary and the receiving container is moved.

FIG. 1 illustrates an inventive device 11. It consists of a housing 12, in which the hereinafter described devices are arranged. A roller conveyor 14 is provided, on which circuit boards coming from the left are delivered, for example, from other processing stations. A receiving container 15 is provided to the right thereof and in a plane lying thereabove, into which receiving container circuit boards are placed. Below the receiving container 15 and arranged approximately in an upward direction at the same level as the roller conveyor 14 is a storage container 18 for the partition layers.

The receiving container 15 can be moved laterally horizontally, as will become clear from the following disclosure. Whereas the storage container 18 is stationary.

A first grappling device 20 is arranged above the roller conveyor 14. It consists of a grappling arm 21, which is fastened at the top to a base mounting 22 and can be vertically moved by same. An extension arm 23 is arranged at the bottom of the grappling arm 21. Extension arm 23 carries grappling means 24, which form a plane downwardly and by means of which a circuit board can be gripped. The grappling means 24 can thereby be designed, for example, as suction devices, like suction cups or the like.

A second grappling device is arranged above the storage container 18, which grappling device is similar to the first grappling device 20 and can have essentially the same design. It also consists of a grappling arm 31, a base mounting 32, an extension arm 33 and grappling means 34 arranged thereon, which grappling means form a plane in downward direction. The grappling means 34 are designed to grip the partition layers, for example paper.

The receiving container 15 is in the illustration of FIG. 1, which corresponds to the initial position of the first exemplary method, arranged directly above the storage container 18 and also directly thereabove the second grappling device 30.

Figure 2:
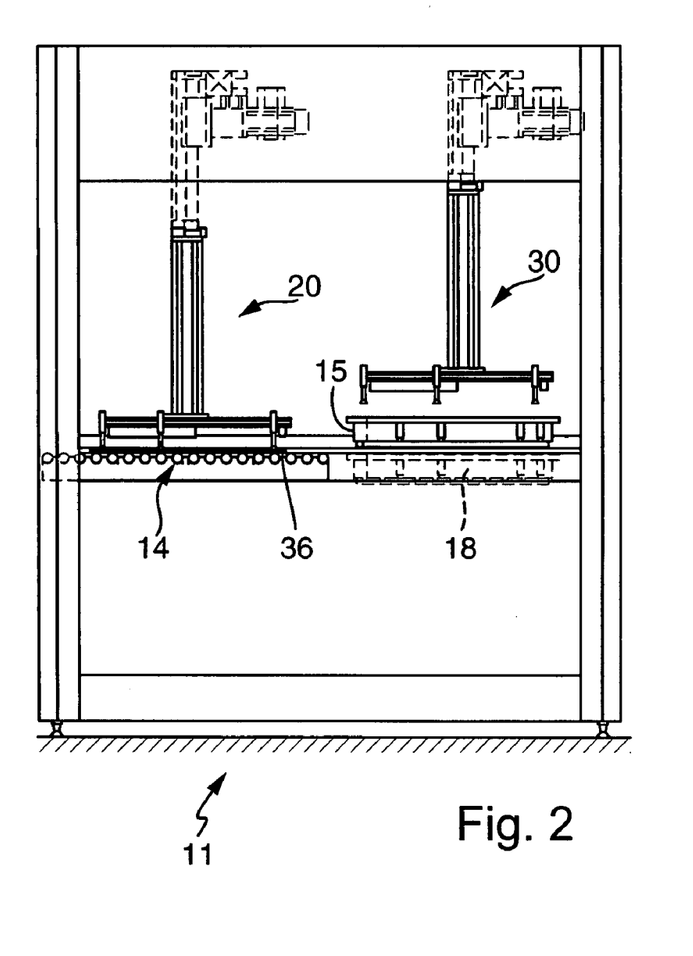

The next step is illustrated in FIG. 2. A circuit board 36 is delivered on the roller conveyor 14 and stops, suitably controlled, exactly under the first grappling device 20. Same has already been lowered so far that the grappling means 24 grips the circuit board 36.

Figure 3:
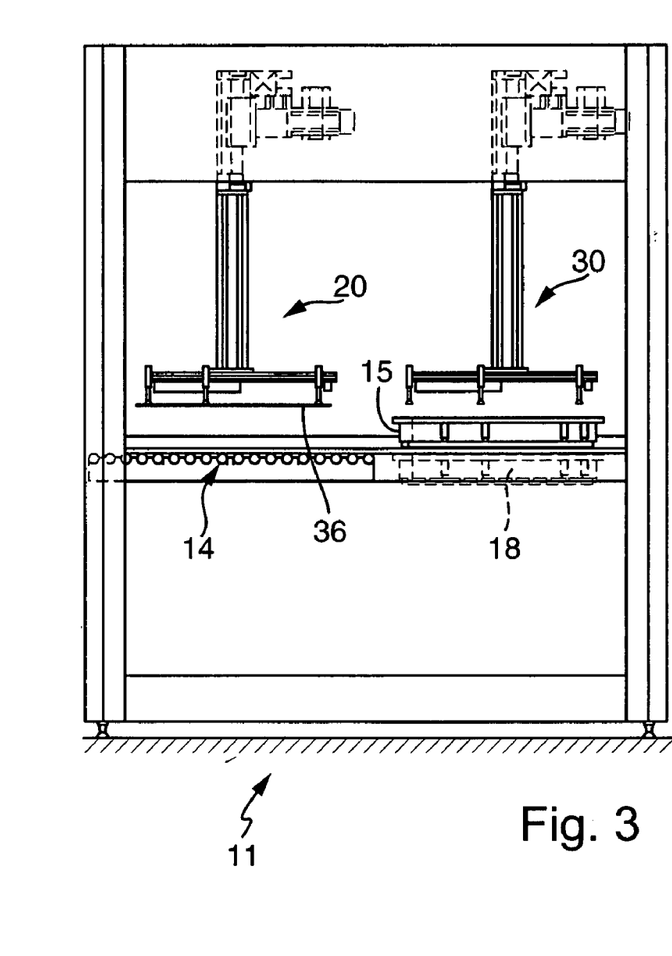

The above-mentioned method step a) is illustrated in FIG. 2 and in FIG. 3. The first grappling device 20 has in FIG. 3 lifted the circuit board 36 gripped according to FIG. 2. The lifting is done to a height that the circuit board 36 hangs at a distance above the receiving container 15. The first grappling device 20 can thereby be pulled upwardly essentially as far as in FIG. 1.

Figure 4:
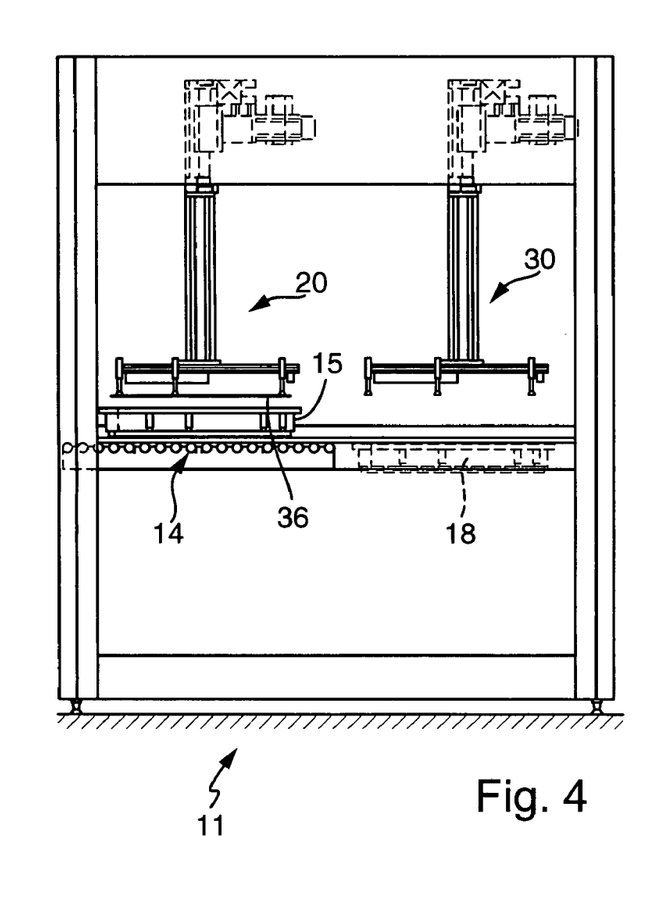

FIG. 4 illustrates the method step b), where the receiving container 15 is moved to the left under the first grappling device 20 or under the circuit board 36. This movement occurs on a track 16 and can occur, for example, by means of rollers and rails or the like.

Figure 5:
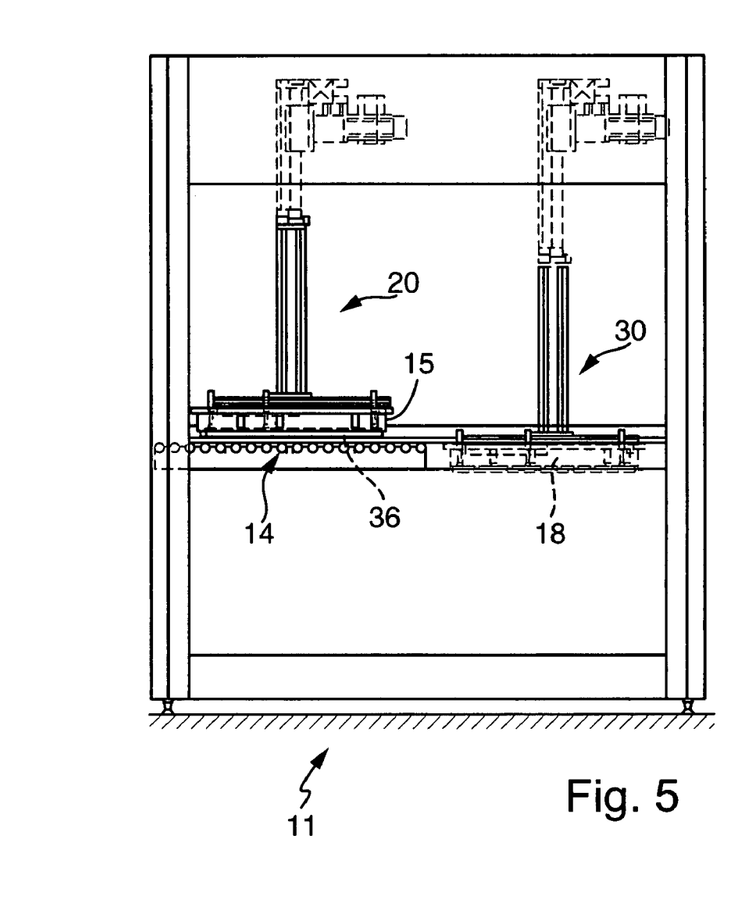

FIG. 5 illustrates on the one hand the method step c). The first grappling device 20 is moved downwardly and places the circuit board 36 into the receiving container 15. The second grappling device 30 carries out, at the same time or shifted in time, at least the first part of the method step d). It is for this purpose moved downwardly into the storage container 18. The grappling means 34 grips thereby a partition layer 38 in the storage container 18. The lowering of the grappling devices 20 and 30 preferably takes place at the same time. On the one hand the two movements do not interfere with one another. On the other hand time can be saved in this manner.

Figure 6:
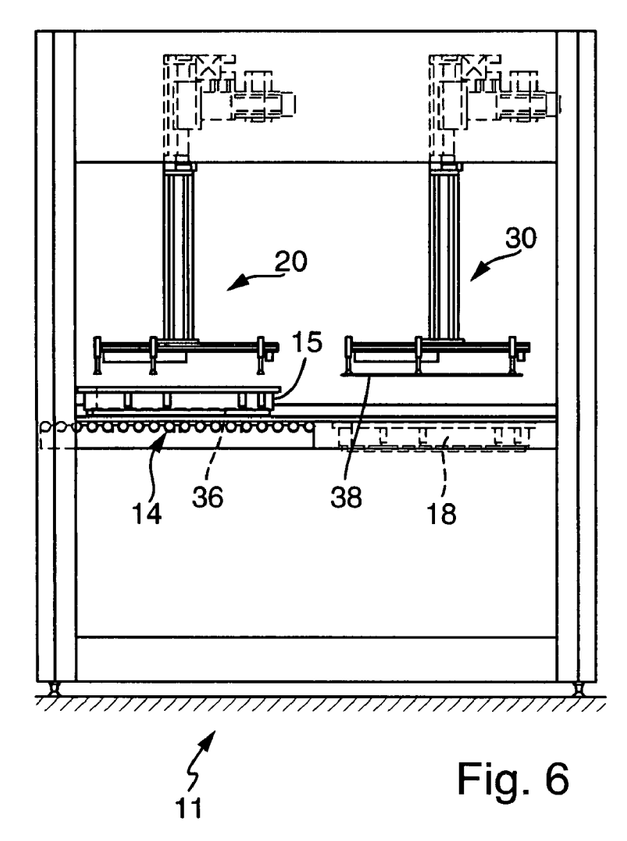

The grappling devices 20 and 30 are again moved upwardly in FIG. 6. The second grappling device 30 lifts the partition layer 38 and thus carries out the second part of the step d). As described earlier, the upward lifting occurs preferably simultaneously in order to save time. In any case the second grappling device is pulled upwardly so far that the partition layer 39 hangs above the receiving container 15.

Figure 7:
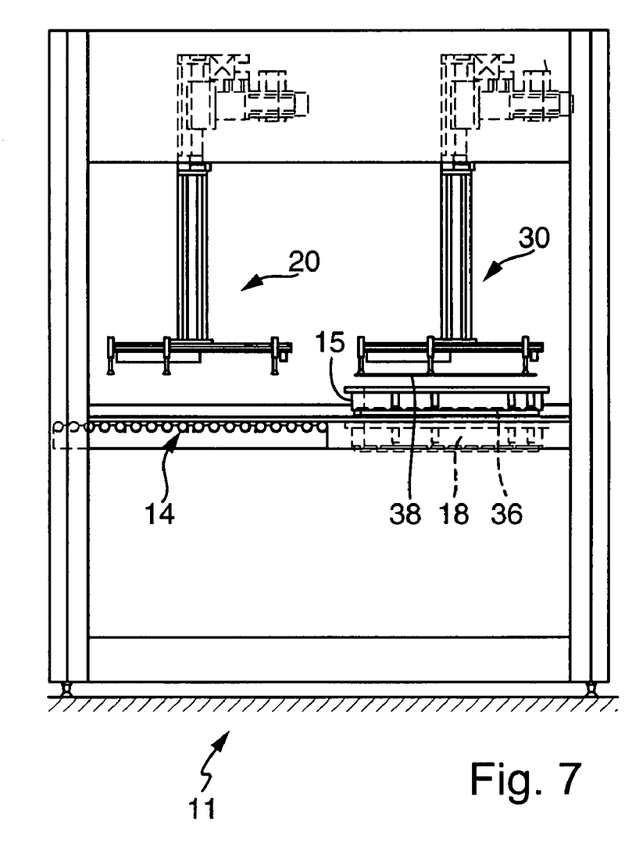

FIG. 7 shows how the receiving container 15 has been moved from the left below the first grappling device 20 to the right below the second grappling device 30. With this occurs the reversal of the step b) according to the step e). The receiving container 15 is exactly below the partition layer 38 or exactly in the position appropriate for the direct vertical lowering of the partition layer 38 into the receiving container 15.

Figure 8:
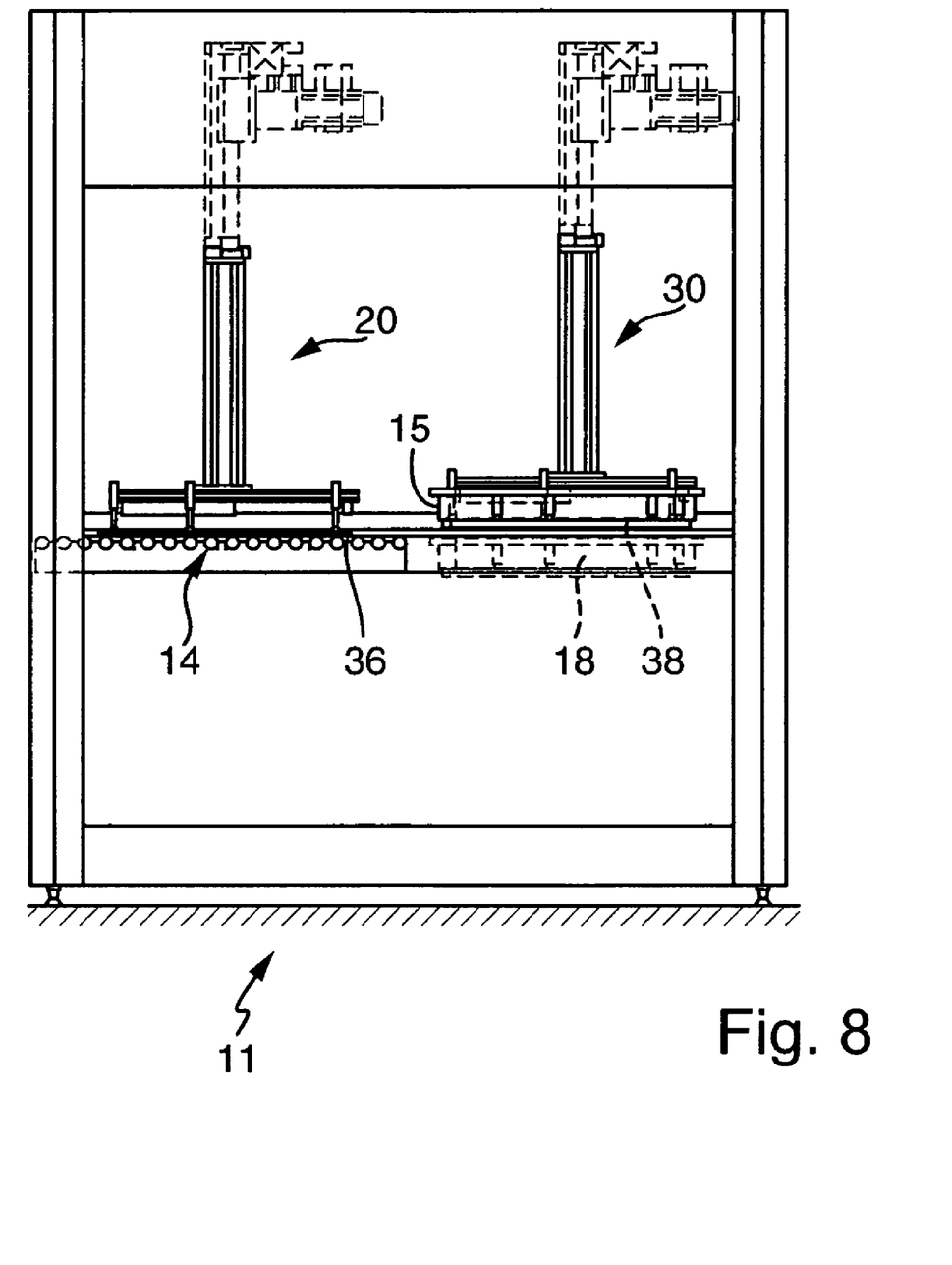

FIG. 8 shows how the second grappling device 30 is moved downwardly and has placed the partition layer 38 into the receiving container 15 and onto the circuit board 36. This corresponds to the step f).

A new circuit board 36 has, at the same time or in the meantime, been delivered on the roller conveyor 14. The first grappling device 20 is lowered so that the grappling means 24 grip the circuit board 36. This corresponds, but for the lowered second grappling device 30, to the illustration in FIG. 2. It can thus be recognized how the process starts once again.

Figure 9:
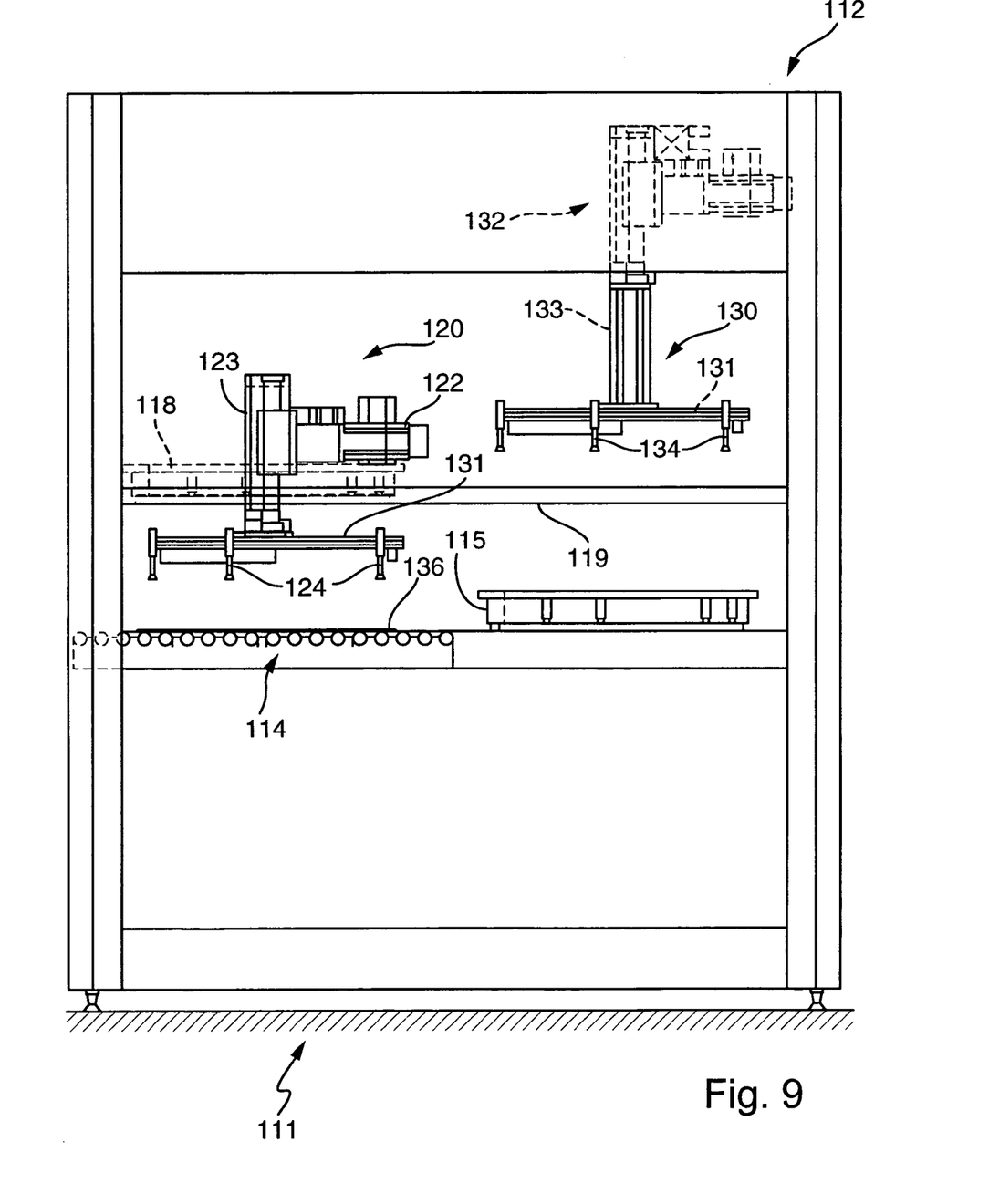
FIGS. 9 to 16 illustrate a second exemplary embodiment of the invention, whereby the grappling device for the circuit boards is moved together with a storage container for partition layers.

A second exemplary embodiment of the invention is illustrated in FIG. 9. The device 111 has thereby a housing 112 and thus is similar to the one of FIG. 1.

A roller conveyor 114 is provided in the left area, which roller conveyor can also extend farther to the left and on which circuit boards are delivered. A receiving container 115 is provided on the right next to the roller conveyor 114 and is arranged lying thereabove. The circuit boards with partition layers therebetween are stacked into this receiving container 115.

A storage container 118 is arranged above the roller conveyor 114. It can be moved on a horizontally extending track 119. The track 119 extends so far that the storage container 118 can be moved between a position above the roller conveyor 114 and a position above the receiving container 115.

A first grappling device 120 is also arranged above the roller conveyor 114. It consists of a grappling arm 121, which is arranged vertically movably on a base mounting 122. The grappling arm 121 carries at the bottom an extension arm 123 with downwardly directed grappling means 124. The grappling means 124 form thereby a plane, similar to the earlier described FIGS. 1 to 8.

The base mounting 122 is designed to be movable in a horizontal direction. It is thereby preferably supported on the track 119 and is movable along said track. It is particularly preferably movable together with the storage container 118, whereby they can be coupled and can have a common drive.

The largest part of the base mounting 122 above is the storage container 118. The extension arm 123 with the grappling means 124 is below the storage container. A second grappling device 130, corresponding to FIG. 1, is arranged above the receiving container 115. It consists of a base mounting 132, a grappling arm 131, an extension arm 133 and grappling means 134. The second grappling device 130 is arranged to be stationary in the horizontal direction and can only operate vertically.

The extension arm 133 with the grappling means 134 is, in the position illustrated in FIG. 9, provided at a distance above the upper edge of the storage container 118. The second grappling device 130 takes partition layers from said storage container, as can be seen in the following figures.

Figure 10:
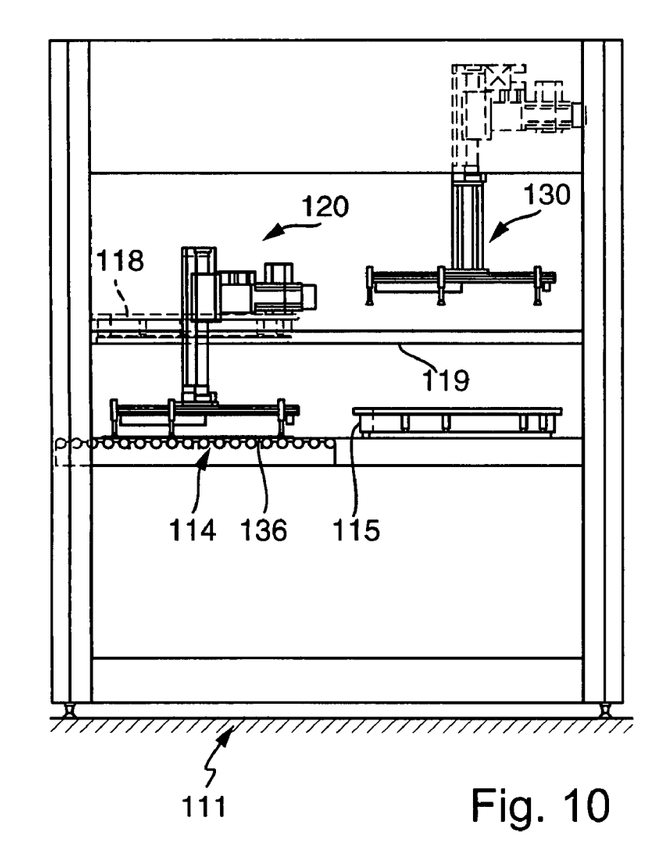

FIG. 10 shows how a circuit board 136 is delivered on the roller conveyor 114. The first grappling device 120 has been lowered so that the grappling means 124 grips the circuit board 136. This corresponds to FIG. 2, the first part of the step a).

Figure 11:
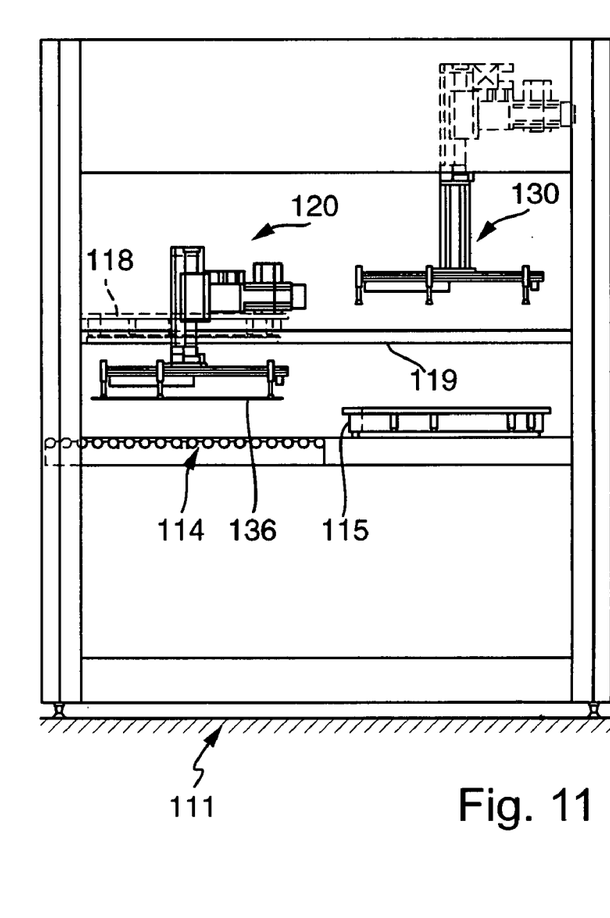

FIG. 11 illustrates the second part of the step a) of the inventive method. The circuit board 136 has here namely been lifted high enough by the first grappling device 120 that it is above the upper edge of the receiving container 115.

Figure 12:
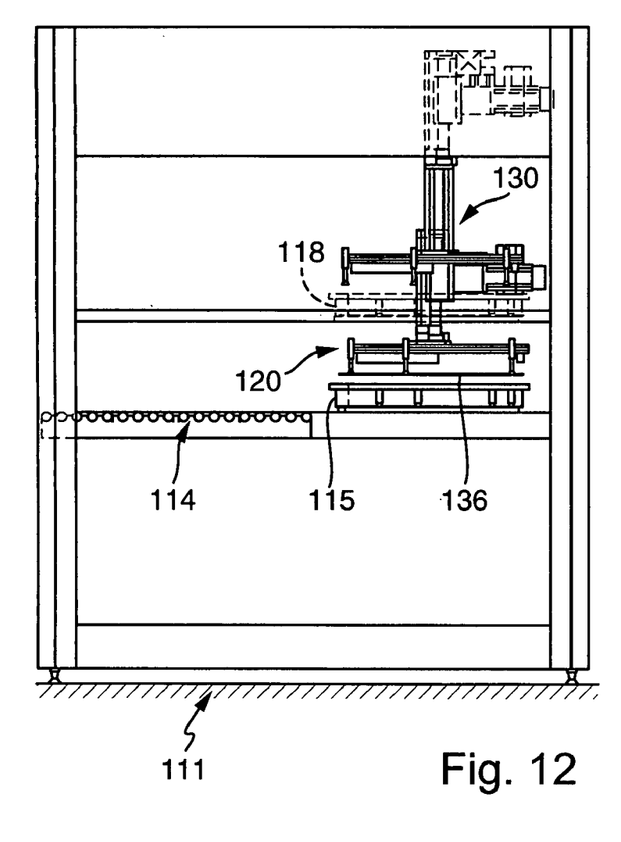

FIG. 12 illustrates the step b), namely, wherein the first grappling device 120 together with the storage container 118 has moved to the right. It is thereby in a position above the receiving container 115. Thus the grappling device has here been moved during a relative movement between the first grappling device and the receiving container. It can thereby be recognized how at the same time the storage container 118 has stopped below the second grappling device 130.

Figure 13:
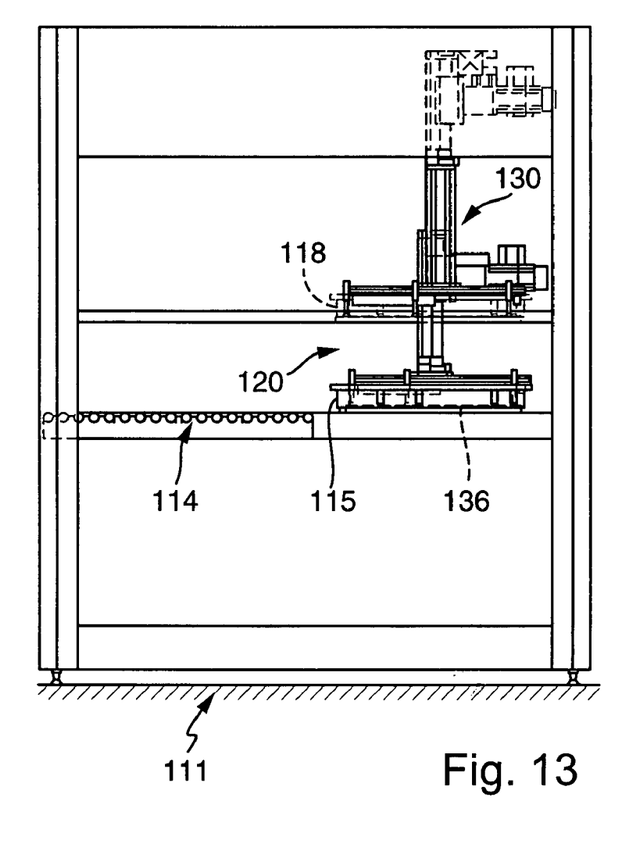

FIG. 13 illustrates the step c), where the first grappling device 120 has placed the circuit board 136 into the receiving container 115. The second grappling device 130 has at the same time been lowered into the storage container 118 and has gripped a partition layer 138. This corresponds to the first part of the step d). As described earlier, the lowering of the grappling devices simultaneously can advantageously save time, however, it is not necessary.

Figure 14:
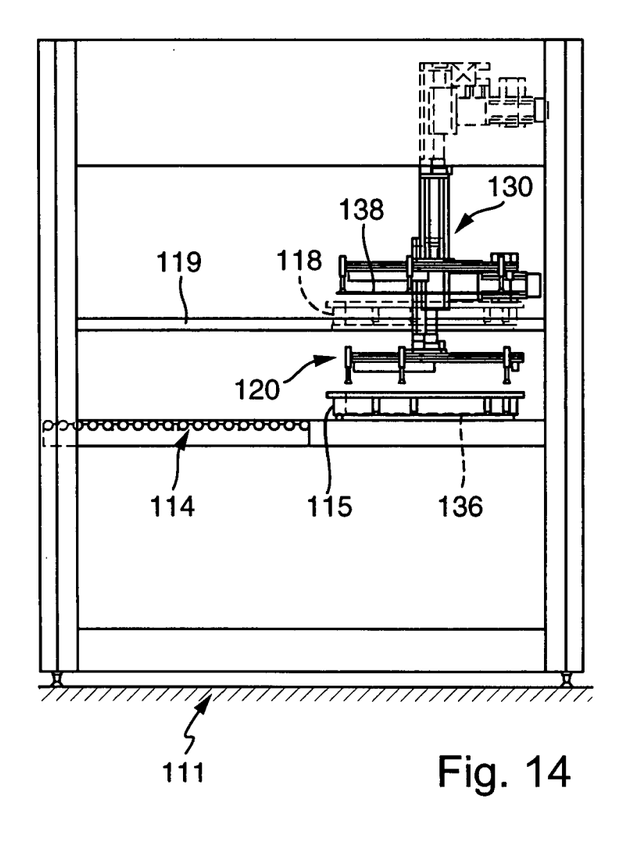

FIG. 14 illustrates the second part of the step d), namely the lifting of a partition layer 138 out of the storage container 118 by the second grappling device 130. The first grappling device 120 is here also, for example, simultaneously moved upwardly out of the receiving container 115.

Figure 15:
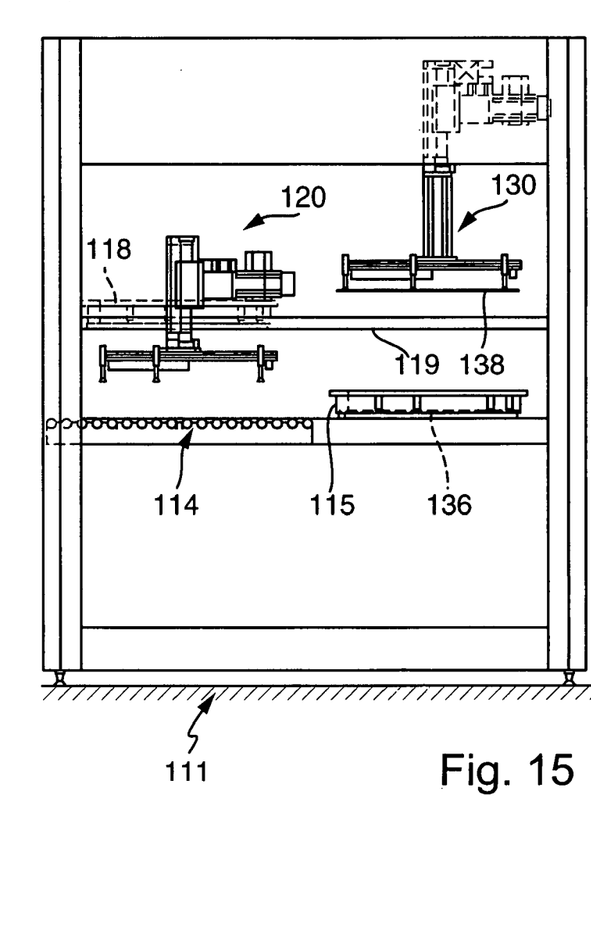

FIG. 15 illustrates in turn the step e), where the first grappling device 120 and the storage container 118 have been moved again to the left into the position according to FIG. 9. The receiving container 115 is now accessible for placing of the partition layer 138.

Figure 16:
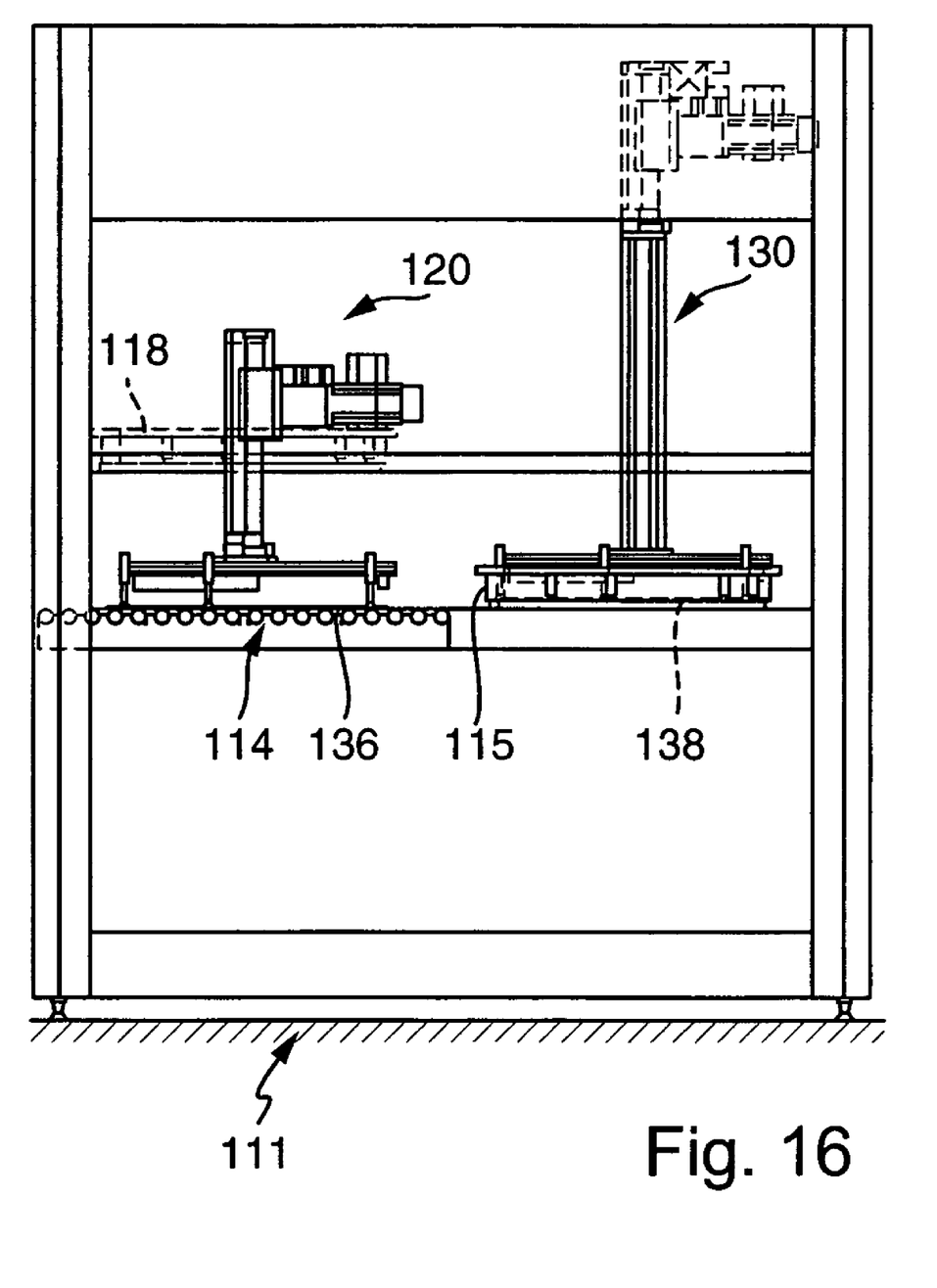

This placing according to the method step f) is illustrated in FIG. 16. The second grappling device 130 is, for this purpose, moved downwardly into the storage container 118. A new circuit board 136 has been delivered also simultaneously from the left on the roller conveyor 114. The first grappling device 120 has here already been lowered and has gripped this circuit board. The method can now, according to FIG. 10, start once again.

It becomes clear from the drawings and the above description that in the first exemplary embodiment of the invention, only the receiving container 15 is moved back and forth below the two grappling devices 20 and 30. In the second exemplary embodiment both the storage container 118 and also the first grappling device 120 are moved. This means, on the one hand, an increased mechanical and control-technical expenditure, in particular with regard to the first movable grappling device 120. On the other hand, only one circuit board is hereby in each case moved laterally. The entire, possibly almost full, receiving container is moved in each case in the first exemplary embodiment.

The invention claimed is:

1. A method for the introduction of planar substrates into a receiving container, the method comprising the following steps:
  a) gripping and lifting a substrate with a first grappling device;
  b) moving the first grappling device and the receiving container relative to each other, so that the receiving container is located below the first grappling device;
  c) placing the substrate into the receiving container;
  d) gripping and lifting a partition layer from a store of partition layers with a second grappling device;
  e) reversion of step b) such that the receiving container is accessible from above and is below the second grappling device;
  f) placing the partition layer in the receiving container onto the previously supplied substrate; and
  g) restarting the process at a),
  the method further comprising delivering the substrate by transporting means and moving the substrate with the first grappling device away from the transporting means into the receiving container, whereby the moving of the first grappling device between the gripping of the substrate and the placing into the receiving container occurs essentially vertically, and
  moving the receiving container back and forth laterally in a horizontal direction between a position for supplying the substrate below the first grappling device and a position for supplying the partition layer below the second grappling device, including arranging the first grappling device above the transporting means for the substrates.

2. The method according to claim 1, further comprising holding at least one of said first and second grappling devices stationary in a horizontal direction.

3. The method according to claim 1, further comprising moving the receiving container above the plane of the store of partition layers, preferably through the store of partition layers and lifting a partition layer from the store by means of the second grappling device and placing said partition layer into the receiving container positioned below the second grappling device.

4. A method for the introduction of planar substrates into a receiving container, the method comprising the following steps:
  a) gripping and lifting a substrate with a first grappling device;
  b) moving the first grappling device and the receiving container relative to each other, so that the receiving container is located below the first grappling device;
  c) placing the substrate into the receiving container;
  d) gripping and lifting a partition layer from a store of partition layers with a second grappling device;
  e) reversion of step b) such that the receiving container is accessible from above and is below the second grappling device;
  f) placing the partition layer in the receiving container onto the previously supplied substrate; and
  g) restarting the process at a),
  the method further comprising delivering the substrate by transporting means and moving the substrate with the first grappling device away from the transporting means into the receiving container, whereby the moving of the first grappling device between the gripping of the substrate and the placing into the receiving container occurs essentially vertically, and
  moving the receiving container above the plane of the transporting means and lifting the substrate from the transporting means by means of the first grappling device in the absence of the receiving container, and thereafter positioning the receiving container and placing the substrate into the receiving container under the first grappling device.

5. The method according to claim 4, further comprising moving the receiving container above the plane of the store of partition layers, preferably through the store of partition layers and lifting a partition layer from the store by means of the second grappling device and placing said partition layer into the receiving container positioned below the second grappling device.

6. The method according to claim 4, further comprising holding at least one of said first and second grappling devices stationary in a horizontal direction.

7. A method for the introduction of planar substrates into a receiving container, the method comprising the following steps:
  a) gripping and lifting a substrate with a first grappling device;

b) moving the first grappling device and the receiving container relative to each other, so that the receiving container is located below the first grappling device;

c) placing the substrate into the receiving container;

d) gripping and lifting a partition layer from a store of partition layers with a second grappling device;

e) reversion of step b) such that the receiving container is accessible from above and is below the second grappling device;

f) placing the partition layer in the receiving container onto the previously supplied substrate; and g) restarting the process at a), the method further comprising delivering the substrate by transporting means and moving the substrate with the first grappling device away from the transporting means into the receiving container, whereby the moving of the first grappling device between the gripping of the substrate and the placing into the receiving container occurs essentially vertically, and wherein the store of partition layers is a storage container that is movable in a horizontal direction, the method further comprising moving the storage container between a position for supplying the substrate by the transporting means for the substrate, and a position for supplying the partition layer below the second grappling device.

8. The method according to claim 7, further comprising moving one of the two grappling devices in a horizontal direction between a position above the transporting means and a position above the receiving container, holding the receiving container at least while it is being filled, and moving the storage container at least into a position for the second grappling device to remove a partition layer from the storage container.

9. The method according to claim 8, further comprising moving the first grappling device laterally between a position for supplying the substrate above the transporting means for the substrate and a position below the second grappling device.

10. The method according to claim 7, further comprising arranging the second grappling device above the first grappling device and gripping a partition layer from the storage container, while both grappling devices and receiving container and storage container are arranged along a vertical line.

11. The method according to claim 7, further comprising moving the receiving container above the plane of the store of partition layers, preferably through the store of partition layers and lifting a partition layer from the store by means of the second grappling device and placing said partition layer into the receiving container positioned below the second grappling device.

12. The method according to claim 7, further comprising holding at least one of said first and second grappling devices stationary in a horizontal direction.

* * * * *